US 6,576,831 B2

(12) United States Patent
Woditsch et al.

(10) Patent No.: US 6,576,831 B2
(45) Date of Patent: Jun. 10, 2003

(54) MULTICRYSTALLINE SILICON HAVING A LOW PROPORTION OF ACTIVE GRAIN BORDERS

(75) Inventors: Peter Woditsch, Krefeld (DE); Gunther Stollwerck, Krefeld (DE); Christian Hässler, Krefeld (DE); Wolfgang Koch, Krefeld (DE)

(73) Assignee: Deutsche Solar GmbH, Freiberg (DE)

( * ) Notice: Subject to any disclaimer, the term of this patent is extended or adjusted under 35 U.S.C. 154(b) by 0 days.

(21) Appl. No.: 09/990,505

(22) Filed: Nov. 14, 2001

(65) Prior Publication Data

US 2002/0078992 A1 Jun. 27, 2002

(30) Foreign Application Priority Data

Nov. 15, 2000 (DE) .......................... 100 56 726

(51) Int. Cl.⁷ ................. H01L 31/0264; H01L 31/036; H01L 31/0368; C30B 11/02
(52) U.S. Cl. ................. 136/258; 136/261; 136/290; 257/64; 257/75; 257/461; 438/97; 438/89; 438/488; 438/491; 23/295 R; 23/300; 117/924; 164/122.2; 423/348
(58) Field of Search .................. 136/258, 261, 136/290; 257/64, 75, 461; 438/97, 89, 488, 491; 423/348; 117/924; 164/122.2; 23/295 R, 300

(56) References Cited

U.S. PATENT DOCUMENTS 4,561,930 A * 12/1985 Schwirtlich et al. .......... 23/301
6,013,872 A * 1/2000 Woditsch et al. ........... 136/255
6,362,021 B2 * 3/2002 Ford et al. .................... 438/97

FOREIGN PATENT DOCUMENTS

DE          19854838 A1 * 5/2000

* cited by examiner

*Primary Examiner*—Alan Diamond
(74) *Attorney, Agent, or Firm*—Connolly Bove Lodge & Hutz LLP

(57) ABSTRACT

Directionally solidified, multicrystalline silicon having a low proportion of electrically active grain borders, its manufacturing and utilisation, as well as solar cells comprising said silicon and a method of manufacturing said cells.

9 Claims, 2 Drawing Sheets

P-Typ Wafer

N-Typ Wafer

P-Typ Wafer

N-Typ Wafer

MULTICRYSTALLINE SILICON HAVING A LOW PROPORTION OF ACTIVE GRAIN BORDERS

BACKGROUND OF THE INVENTION

1. Field of the Invention

The present invention relates to directionally solidified, multicrystalline silicon having a low proportion of electrically active grain borders, its manufacturing and utilisation, as well as to solar cells comprising said silicon and a method of manufacturing said cells.

2. Background Art

Typically, silicon wafers to be further processed to become solar cells are made of high-purity, positively doped (mostly boron-doped) silicon which after being melt open is converted by directional crystallisation, e.g. by using the SOPLIN technique (solidification by planar interface) to large-sized blocks or bars having a typical weight from 150 to 250 kg. After cooling down, the block material is cut to columns having various cross-section surfaces using belt saws. Then, said columns are cut to disks having a thickness of approximately 200 to 400 μm using inner hole saws or multiple wire saws. The silicon wafers produced in such manner can then be further processed to become solar cells.

Typically, the surfaces of the silicon disks are at first slightly etched in a bath containing an alkaline medium such as soda lye. Then, phosphorus is diffused into one face of the wafer which changes the conductivity of this layer from positively conductive to negatively conductive. At the interface, an electrical field (the p/n transition) originates which separates the light-generated charged particles from one another. Contacts are printed onto the front and back sides to allow carrying-off the electron hole pairs which have been produced by light incidence. Finally, an anti-reflection layer is applied onto the front side which significantly reduces loss due to reflection. The manufacturing sequence may be altered such that the anti-reflection layer is applied prior to printing the contacts which are then burnt through the anti-reflection layer in order to obtain a low transition resistance to the silicon.

The initial material used must meet very high requirements regarding its chemical purity because metallic and non-metallic impurities as well as inclusions of electrically active particles such as silicon carbide (SiC) affect the specific electric resistance, the conductivity type of the silicon as well as the lifetime of the charged particles and/or the free path lengths of the minority charged particles thus having an adverse effect on the efficiency, i.e. the performance of the solar cell. Apart from the impurities caused by foreign atoms, the efficiency of multicrystalline solar cells is affected by extended crystal defects such as grain borders and offsets. In addition to reducing impurities, present research efforts focussing on increasing the efficiency of solar cells on the basis of multicrystalline silicon aim at achieving a reduction of the electric activity of extended crystal defects such as grain borders.

SUMMARY OF THE INVENTION

It is an object of the present invention to provide multicrystalline silicon having low electric activity at the grain borders which in particular is suitable for being used in highly efficient solar cells, and to provide said solar cells.

The subject of this invention is directionally solidified multicrystalline silicon characterised in that electrically active grain borders occurring in less than 3% of the material volume.

The electric grain border activity is defined by measuring the resistance topography. The specific resistance of the resistance topography is determined using the 4-tip technique (H. -F. Hadamovsky, "Werkstoffe der Halbleitertechnik" [Working Material of Semiconductor Technology], p. 183–185, VEB Leipzig 1985.).

To this end, a measuring head comprising four needles spaced apart at 0.63 mm is placed on a silicon sample (e.g. a wafer, a column portion, or another shaped part made of silicon having at least one flat surface) using a pressure of 800 N. A constant current of approx. 300 μA flows through each two needles. The potential difference generated by the electric field is measured at the other two needles. The specific resistance of the silicon sample is determined according to Ohm's law. Taking into account the geometry of the needles, the specific resistance ρ can be calculated using $$\rho = \frac{\Delta U}{I} \frac{2\pi}{\ln 2} D \qquad (1)$$

equation (1)

where ΔU denotes the potential difference measured, I denotes the constant current, and D denotes the sample thickness wherein D is typically less than 5 mm. The resolution of the resistance measurement is approximately 1 mΩcm.

If the resistance is measured across a grain border, it no longer copes with Ohm's law. Instead, at least one of the resistance values measured in x or y direction ($\rho_x$ and $\rho_y$, respectively) is significantly larger than the resistance of the volume material due to the potential barrier occurring at the grain border. The term "active grain border" means that at least one of the two values $\rho_x$ and $\rho_y$ exceeds by more than three times the median value of the specific resistance of the volume material. Such a grain border not only represents a high electric resistance in one direction but also a reactive centre in which electrons and holes recombine while releasing power.

The percentage of electrically active grain borders is determined via resistance topographies applied on silicon disks having a size of 10×10 cm², a basic dotation of $1$–$5 \times 10^{16}$ cm$^{-3}$ and a thickness of 300–350 μm. The aforementioned pressure force of the tips of 800 N and a measuring current of 300–350 μA are used. The step width of the individual measurement is 600–700 μm so that approximately 150×150=22,500 measurements are performed on the entire disk surface.

In the directionally solidified multicrystalline silicon according to the invention, only less than 3% of all measuring points are considered as electrically active grain borders corresponding to the above definition while in the case of prior art materials for multicrystalline solar cells typically 5–15% of the measuring points are associated with electrically active grain borders. The small amount of electrically active grain borders in the silicon according to this invention is not accomplished by a larger grain size (i.e. a smaller total number of grain borders) but by significantly reducing the electric activity of the individual grain borders while retaining the same grain size (the typical grain diameter is 0.5–2 cm).

Most preferably, the specific resistance of the silicon according to this invention ranges between 20 and 10,000 mΩcm, and even more preferably between 100 and 2,000 mΩcm.

Surprisingly, it was found that directionally solidified multicrystalline silicon having a negative dotation (hereinafter referred to as N type) has significantly less grain border activity than multicrystalline silicon of the P type, i.e. multicrystalline silicon having a positive dotation. The resistance topographies of both types are shown in FIG. 1. Active grain borders are found in the P type silicon (dark colour) while no such grain borders whatsoever are found in the N type silicon.

Hence, the directionally solidified multicrystalline silicon according to this invention is preferably N doped.

The N dotation may be accomplished, for example, using phosphorus, arsenic, stibium, lithium and/or bismuth. To obtain a specific resistance of 1,000 mΩcm, a dope amount of approximately 0.1 ppma corresponding to $5 \times 10^{15}$ atoms/cm$^{-3}$ is required.

Another subject of the present invention is a method for manufacturing the silicon according to this invention in which method mono- or multicrystalline silicon is molten open and directionally solidified.

To this end, preferably doped mono- or multicrystalline silicon is molten open with $10^{15} - 10^{17}$ atoms/cm$^3$ of P, As, Sb, Li and/or Bi. The dope comprises at least one of the aforementioned elements. The melting is directionally crystallised either directly in the crucible or after being cast in dies, e.g. using the SOPLIN technique, to form large blocks or bars. Then the multicrystalline silicon blocks are preformatted by rough dividing in a manner known to a person skilled in the art and then sawed open to become silicon wafers using wire or inner hole saws.

Another subject of this invention are solar cells comprising the silicon according to this invention.

Preferably, the solar cells according to this invention comprise a basic dotation of phosphorus, arsenic, stibium, lithium and/or bismuth.

In a particular embodiment, the solar cells according to this invention are characterised in that the local short-circuit current distribution is narrower than in comparable solar cells manufactured on the basis of P type silicon.

The local short-circuit current is measured as follows: The finished solar cell (with or without an anti-reflection layer) is scanned by a focussed laser beam (wavelength between 300 nm and 1,100 nm). During this procedure, the solar cell has a pre-voltage of 0 V. Simultaneously, the current induced by the laser light (short-circuit current Ik) is measured in the solar cell using a current meter to obtain a topography of the short-circuit current. Areas having a low local short-circuit current indicate high recombination velocities which may be caused by crystal defects or impurities or a combination of both. Areas having a high short-circuit current indicate good crystal quality. An important finding from the measurements is the homogeneity of the electronic properties of the silicon as scattered small areas having a low local short-circuit current affect the performance of the entire solar cell. A narrow short-circuit current distribution is a measure for homogenous volume properties of the silicon and thus a necessary precondition for high degrees of efficiency. A broad short-circuit current distribution suggests the presence of electronically effective defects and thus a lower achievable maximum efficiency.

The efficiency of a solar cell depends not only upon the volume properties of the material but also upon the solar cell process and the interrelation between material properties and process.

The term "solar cell" in the sense of this invention includes solar cells with pn transitions, metal-insulator-semiconductor transitions or metal-semiconductor transitions. The solar cells according to this invention may comprise either at least one element of the fifth and at least one element of the third main group, such as P, B, Al, Ga and/or In or an epitaxial layer forming the pn transitions.

The elements of the 3$^{rd}$ and 5$^{th}$ main groups are present in quantities ranging preferably between $10^{15}$ and $10^{21}$ atoms/cm$^3$.

The solar cells according to this invention may be manufactured for example by using the technique described in "Sonnenenergie: Photovoltaik [Solar Power: Photo Voltaics], p. 148 to 169, Teubner Verlag 1994" wherein silicon preferably having $10^{15}$ and $10^{17}$ atoms/cm$^3$ of phosphorus, arsenic, stibium, lithium and/or bismuth is used or the silicon is doped with the respective contents.

Another subject of this invention is a method for manufacturing solar cells wherein a silicon disk made of the multicrystalline silicon according to this invention is doped with at least one element from the 3$^{rd}$ main group, preferably boron and initially superficially etched in an alkaline medium such as a soda lye bath and a hydrofluoric acid bath and then provided with an N doped layer or doped with at least one element from the 5$^{th}$ main group and, following the etching baths, is provided with a P doped layer.

In a preferred embodiment, a silicon disk P doped for example with boron is provided with an N doped layer, the so-called emitter, by diffusing in phosphorus in a resistance-heated quartz tube furnace. The diffusing-in of phosphorus is preferably performed from the gaseous phase using, for example, POCl$_3$. Preferably, the temperature during the phosphorus diffusion ranges between 700° C. and 1,200° C., more preferably between 800° C. and 950° C. The diffusion duration is preferably approx. 1 h at low temperatures of e.g. 800° C. and a few minutes at higher temperatures (950° C.). Likewise, a silicon disk N doped, for example, with phosphorus, arsenic, stibium, lithium and/or bismuth may be provided with a thin, near-surface, p conductive emitter and thus a pn transition by diffusing in an element generating a P dotation, preferably boron. As before, the diffusion is performed preferably from the gaseous phase, for example by using BBr$_3$. A diffusion from a boron-containing glass applied onto the wafer by spin coating is also possible. The temperature of the boron diffusion is 50° C.-200° C. higher than with the phosphorus diffusion.

The pn transition of the solar cell may also be implemented by applying one or several n or P doped layers (thickness between 0.1 and 100 μm) onto the p or N doped silicon disk using gaseous phase or liquid phase epitaxy.

Following the formation of the pn transition, the thin upper n or P doped layer formed by diffusion is provided with a front side contact preferably sputtered through a mask or printed which has a grid design and has an area coverage of 2–20%. Preferably, such metals are used to form said front side contact which allow a particularly low-Ohm transition to the diffused layer, such as titanium or aluminium. If for example phosphorus was diffused in (N doped emitter), preferably titanium is used which may be reinforced by one or several further metal layers to reach a total thickness of a few μm. The back side of the silicon wafer is completely metallised or metal-printed or also provided with a grid-like contact. Preferably, aluminium is used here which may also be reinforced by one or several further metal layers to reach a total thickness of a few μm. The metallised or printed contacts must be burnt in at temperatures above 500° C. to achieve a low transition resistance.

Finally, the solar cell may be provided with an anti-reflection layer on the emitter side to reduce the proportion of sunlight reflected by the solar cell. to this end, one or several transparent layers having refraction indices ranging between those of silicon and air or glass are applied with layer thicknesses providing one or several reflection minima of the thin layer in the visible or infrared spectral scope. Preferably, $TiO_2$ or $SiN_x$ (wherein $1 \leq x \leq 2$) is applied by evaporation at a thickness of approximately 0.1 µm to form the anti-reflection layer. The manufacturing sequence may as well be interchanged by applying the anti-reflection layer prior to the contacts and then burning the contacts through the anti-reflection layer to achieve a low transition resistance to the silicon.

Now the invention will be further explained by way of examples. These examples represent some embodiments of this invention, but the invention is not limited to these examples.

EXAMPLES

Example 1

Figure 1:
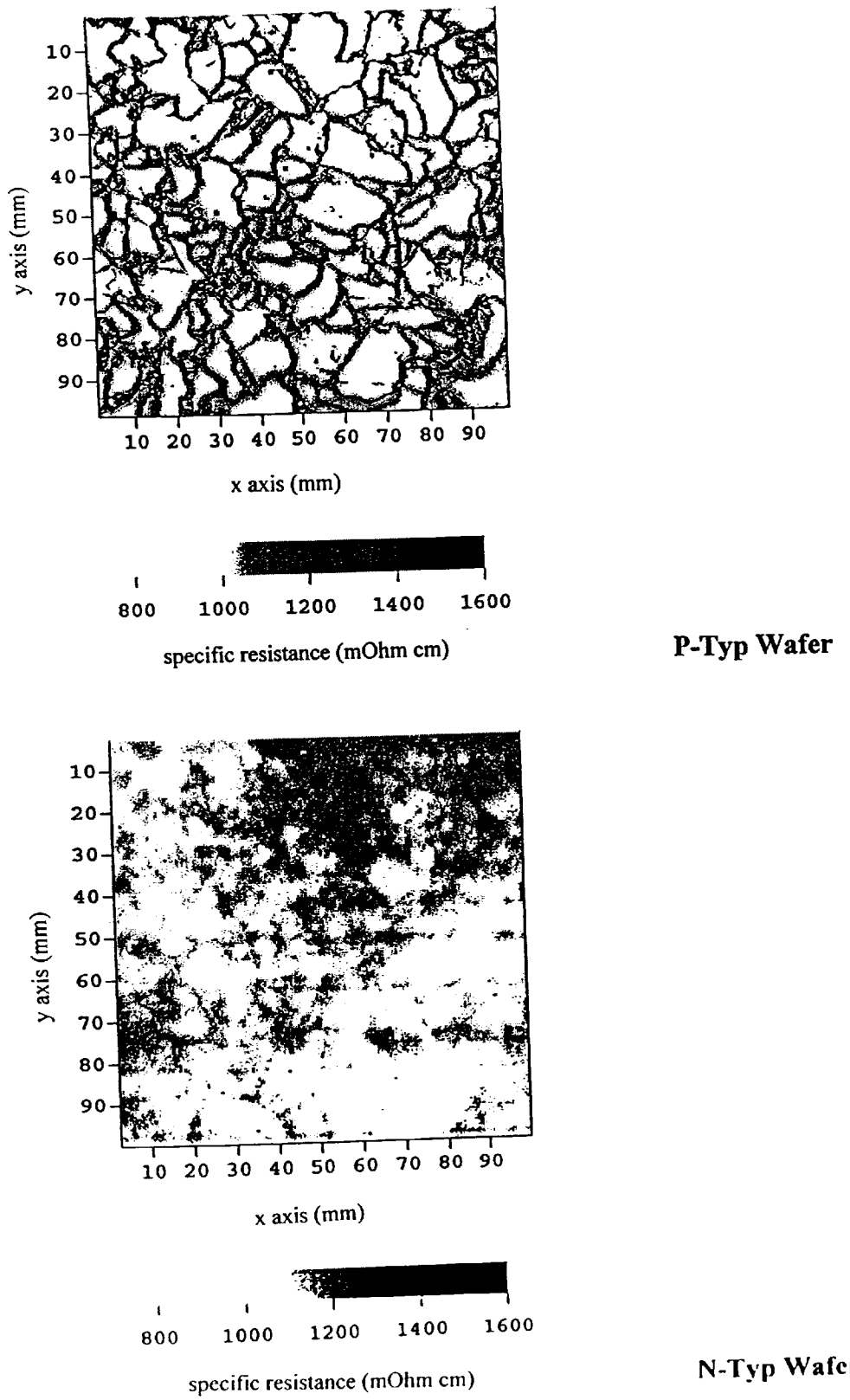
FIG. 1 shows measured resistance topographies on the silicon wafers of the two manufactured silicon blocks of Example 1.

One N type and one P type silicon block were manufactured. For this purpose, multicrystalline silicon was molten open with a dotation of $5 \times 10^{15}$ atoms/cm$^3$ of phosphorus and $5 \times 10^{16}$ atoms/cm$^3$ of boron, respectively, and the melting was directionally solidified directly in the crucible using the SOPLIN technique to form large blocks. Both silicon blocks were preformatted using a belt saw and then sawed open with a multiple wire saw to form silicon wafers. Resistance topographies were measured on the silicon wafers of both blocks. These are shown in FIG. 1. Regarding the P type wafer, the grain border activity caused by the high resistances along the grain borders is clearly visible. The number of measuring points classified as electrically active grain borders amounts to approximately 10% of the total number of measuring points while in the N type wafer practically no electrically active grain borders are discernible.

Example 2

Solar cells were manufactured from silicon wafers manufactured as described in Example 1 using the following method: The wafers were sawed into parts having a size of 5×5 cm$^2$. The solar cells were made of these pieces so that all solar cells had the size 5×5 cm$^2$. After splitting, the wafers were superficially etched in soda lye followed by hydrofluoric acid etching.

Then boron was diffused into the N type and phosphorus into the P type silicon wafers. The diffusion of boron and phosphorus, respectively, was performed from the gaseous phase using $BBr_3$ and $POCl_3$, respectively, at temperatures of 960° C. and 850° C., respectively.

Finally, titanium-palladium-silver contacts were evaporated onto the front and back sides and burnt in at 500° C.

After finishing the manufacture of the solar cells, LBIC (light beam induced current) short-circuit current topographies of solar cells made of N type and P type silicon wafers were measured. To this end, the solar cell is scanned by a focussed laser beam while at the same time the short-circuit current (denoted as Ik in the Figure) induced by the laser light is measured. The resulting LBIC short-circuit current distributions are shown as histograms in FIG. 2.

Figure 2:
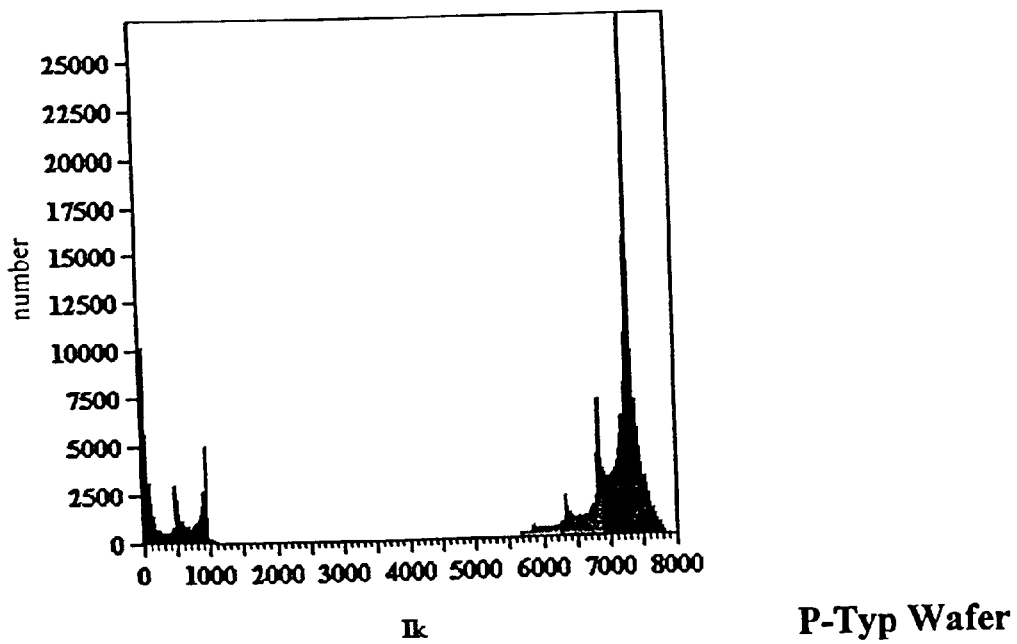
FIG. 2 shows LBIC (light beam induced current) short-circuit distributions of solar cells (made from the silicon wafers of Example 1) shown as histograms.
Figure 2:
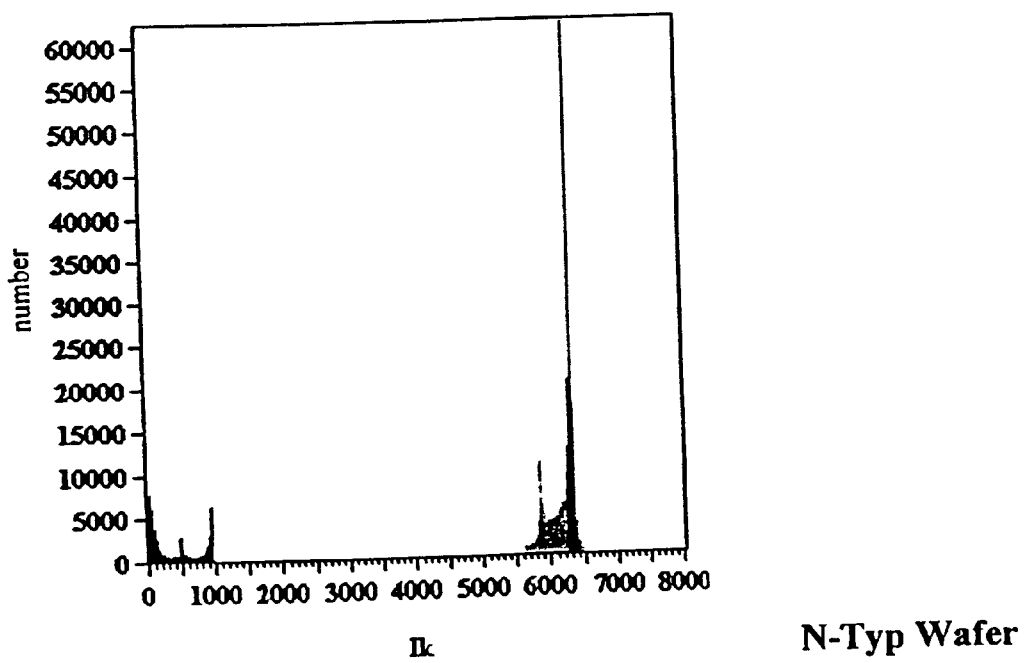

A comparison between the histograms shown in FIG. 2 shows that solar cells made of N type silicon have a closer distribution of local short-circuit currents than solar cells made of P type silicon thus indicating that the N type silicon is more homogenous. Solar cells made of a more homogenous material allow a higher efficiency due to the lack of high recombination areas.

What is claimed is:

1. A body of directionally solidified multicrystalline silicon, wherein electrically active grain borders exist in less than 3% of the volume of the body and further wherein said silicon is N doped.

2. A body of directionally solidified multicrystalline silicon according to claim 1, wherein said silicon is doped with at least one substance selected from the group consisting of phosphorus, arsenic, stibium, lithium and bismuth.

3. A method comprising forming the body of directionally solidified multicrystalline silicon according to claim 1 into solar cells.

4. A solar cell comprising the body of directionally solidified multicrystalline silicon according to claim 1.

5. Solar cells according to claim 4, wherein said solar cell comprises a basic dotation with at least one substance selected from the group consisting of phosphorus, arsenic, stibium, lithium and bismuth.

6. A solar cell according to claim 4, wherein local short-circuit current distribution is narrower than in comparable solar cells made on the basis of P type silicon.

7. A method for manufacturing the solar cell according to claim 4, wherein a silicon disk made of the body of directionally solidified multicrystalline silicon and having electrically active grain borders in less than 3% of the volume of the disk, is doped with at least one element of the 5th main group, superficially etched in an alkaline medium and then etched in a hydrofluoric acid bath and then provided with a P doped layer.

8. A method for manufacturing a body of directionally solidified multicrystalline silicon, wherein electrically active grain borders exist in less than 3% of the volume of the body and further wherein said silicon is N doped, comprising the steps of melting open and directionally crystallizing and N-doping mono- or multicrystalline silicon.

9. A method for manufacturing a solar cell comprising a body of directionally solidified multicrystalline silicon, in which electrically active grain borders exist in less than 3% of the volume of the body, wherein a silicon disk made of the body of directionally solidified multicrystalline silicon and having electrically active grain borders in less than 3% of the volume of the disk, is doped with at least one element of the $3^{rd}$ main group, superficially etched in an alkaline medium and then etched in a hydrofluoric acid bath, then provided with an N doped layer or doped with at least one element of the $5^{th}$ main group and, following the etching steps, is provided with a P doped layer.

* * * * *